(12) United States Patent
Lee et al.

(10) Patent No.: US 10,456,859 B2
(45) Date of Patent: Oct. 29, 2019

(54) LASER BEAM IRRADIATION APPARATUS AND METHOD OF MANUFACTURING ORGANIC LIGHT-EMITTING DISPLAY DEVICE BY USING THE SAME

(71) Applicants: Samsung Display Co., Ltd., Yongin-si (KR); Fraunhofer Gesellschaft zur Foerderung der angewandten Forschung e.V., Munich (DE)

(72) Inventors: Jung-Min Lee, Yongin-si (KR); Alexander Olowinsky, Aachen (DE); Elmar Gehlen, Mechernich (DE); Heidrun Kind, Baesweiler (DE); Arnold Gillner, Roetgen (DE)

(73) Assignees: Samsung Display Co., Ltd., Yongin-si (KR); Fraunhofer Gesellschaft zur Foerderung der angewandten Forshung e.V., Munich (DE)

( * ) Notice: Subject to any disclaimer, the term of this patent is extended or adjusted under 35 U.S.C. 154(b) by 0 days.

(21) Appl. No.: 15/987,218

(22) Filed: May 23, 2018

(65) Prior Publication Data
US 2018/0264589 A1  Sep. 20, 2018

Related U.S. Application Data

(62) Division of application No. 14/293,495, filed on Jun. 2, 2014, now Pat. No. 10,010,973.

(30) Foreign Application Priority Data

May 31, 2013 (KR) ........................ 10-2013-0063083

(51) Int. Cl.
*B23K 26/02* (2014.01)
*H01L 51/52* (2006.01)
(Continued)

(52) U.S. Cl.
CPC .............. *B23K 26/02* (2013.01); *H01L 22/12* (2013.01); *H01L 51/5246* (2013.01); *H01L 51/56* (2013.01)

(58) Field of Classification Search
CPC ......... B23K 26/02; H01L 22/12; H01L 51/56; H01L 51/5246
(Continued)

(56) References Cited

U.S. PATENT DOCUMENTS 5,465,243 A * 11/1995 Boardman ........... G02B 26/108
                                                          369/112.28
8,226,448 B2    7/2012 Voronov et al.
(Continued)

FOREIGN PATENT DOCUMENTS

CN      102185114       9/2011
JP      2005-140588    6/2005
(Continued)

OTHER PUBLICATIONS

Extended European Search Report dated Oct. 8, 2014, in European Patent Application No. 14162974.1.
(Continued)

*Primary Examiner* — Bo Fan
(74) *Attorney, Agent, or Firm* — H.C. Park & Associates, PLC

(57) ABSTRACT

A laser beam irradiation apparatus including a laser source configured to emit light; a collimator configured to collimate the emitted light; a scanner configured to adjust the collimated light to change an irradiation direction thereof; a first lens part configured to focus the adjusted light to irradiate a laser beam on a sealing part; a camera configured to receive visible light passing through the scanner; a heat sensing part configured to receive infrared (IR) light passing through the
(Continued)

scanner; and a control part configured to control a moving direction and an intensity of the laser beam.

8 Claims, 5 Drawing Sheets

(51) Int. Cl.
 *H01L 51/56* (2006.01)
 *H01L 21/66* (2006.01)
(58) Field of Classification Search
 USPC .............................................. 438/15, 33, 29
 See application file for complete search history.

(56) References Cited

U.S. PATENT DOCUMENTS

| | | | | |
|---|---|---|---|---|
| 9,823,201 | B2* | 11/2017 | Morton | G01V 5/0008 |
| 2006/0122502 | A1* | 6/2006 | Scherch | A61B 6/0492 |
| | | | | 600/426 |
| 2007/0045541 | A1* | 3/2007 | Urey | G01J 5/38 |
| | | | | 250/338.3 |
| 2007/0256088 | A1* | 11/2007 | Yamamoto | G11B 7/0037 |
| | | | | 720/601 |
| 2009/0086325 | A1 | 4/2009 | Liu et al. | |
| 2009/0212316 | A1 | 8/2009 | Braune et al. | |
| 2009/0216373 | A1* | 8/2009 | Berti | G01N 23/2073 |
| | | | | 700/258 |
| 2010/0109516 | A1 | 5/2010 | Warashina et al. | |
| 2010/0118912 | A1 | 5/2010 | Lai et al. | |
| 2010/0296291 | A1 | 11/2010 | Kang | |
| 2011/0165814 | A1 | 7/2011 | Lee et al. | |
| 2011/0177746 | A1* | 7/2011 | Voronov | B23K 26/073 |
| | | | | 445/25 |
| 2012/0287026 | A1 | 11/2012 | Masuda | |
| 2013/0023076 | A1 | 1/2013 | Uchiyama | |
| 2013/0334185 | A1 | 12/2013 | Nomaru | |
| 2014/0029013 | A1* | 1/2014 | Yoshii | G01B 9/02091 |
| | | | | 356/479 |
| 2014/0174664 | A1 | 6/2014 | Lee | |

FOREIGN PATENT DOCUMENTS

| | | |
|---|---|---|
| KR | 10-2009-0128431 | 12/2009 |
| KR | 10-2011-0085135 | 7/2011 |
| KR | 10-2012-0033392 | 4/2012 |
| KR | 10-2014-0081509 | 7/2014 |

OTHER PUBLICATIONS

Non-Final Office Action dated Apr. 27, 2015, in U.S. Appl. No. 14/293,495.
Final Office Action dated Nov. 19, 2015, in U.S. Appl. No. 14/293,495.
Non-Final Office Action dated Mar. 11, 2016, in U.S. Appl. No. 14/293,495.
Final Office Action dated Sep. 26, 2016, in U.S. Appl. No. 14/293,495.
Non-Final Office Action dated Feb. 10, 2017, in U.S. Appl. No. 14/293,495.
Final Office Action dated Oct. 12, 2017, in U.S. Appl. No. 14/293,495.
Notice of Allowance dated Apr. 19, 2018, in U.S. Appl. No. 14/293,495.

* cited by examiner

LASER BEAM IRRADIATION APPARATUS AND METHOD OF MANUFACTURING ORGANIC LIGHT-EMITTING DISPLAY DEVICE BY USING THE SAME

CROSS-REFERENCE TO RELATED APPLICATION

This application is a Divisional of U.S. patent application Ser. No. 14/293,495, filed on Jun. 2, 2014, which claims priority from and the benefit of Korean Patent Application No. 10-2013-0063083, filed on May 31, 2013, both of which are hereby incorporated by reference for all purposes as if fully set forth herein.

BACKGROUND OF THE INVENTION

Field

The present disclosure relates to a laser beam irradiation apparatus used to seal a substrate and a method of manufacturing an organic light-emitting display device by using the same.

Discussion of the Background

In the recent times, portable and thin flat panel display devices have increasingly been used for the displays of electronic devices. Among the flat panel display devices, electroluminescence display devices are a self-emitting type of display device having characteristics such as wide viewing angles, good contrast, and fast response times and thus attract much attention as those of the next generation display devices. Also, the organic light-emitting display devices, of which the emitting layer is formed of organic materials, are known for better luminance, driving voltage, and response time characteristics than the inorganic light-emitting display devices and can realize multicolor emission.

Generally, the organic light-emitting display devices have configurations that one or more organic layers are arranged, including an emitting layer between a pair of electrodes.

As far as the organic light-emitting display devices are concerned, when moisture or oxygen penetrates from the ambient environment to the inside of a device, the electrode materials are likely oxidized and peeled off, and for this reason, the service life of the organic light-emitting device is shortened, the emission efficiency is degraded, and the emission color is degenerated.

Therefore, in manufacturing an organic light-emitting display device, the sealing process that isolates the organic light-emitting device from the outside is generally performed in order to prevent the penetration of moisture. The conventional sealing methods include a method that laminates an organic thin film and an organic polymer, such as polyester (PET), on the second electrode of an organic light-emitting display device and a method that forms a moisture absorbent in an encapsulating substrate, charges nitrogen gas into the encapsulating substrate, and seals the edge of the encapsulating substrate with a sealant, such as epoxy.

However, because these methods have failed to prevent 100% of the degrading factors such as moisture and oxygen from penetrating from the outside, and these methods are also very complicated to implement, they could not be applied without modifications to organic light-emitting display devices that are very vulnerable to moisture. To solve such problems, a substrate-sealing method that enhances the adhesiveness between the organic light-emitting device substrate and the encapsulating substrate by using a sealant, such as frit, has been developed.

By using a structure in which the organic light-emitting display device is sealed with frit coated on a glass substrate, the space between the organic light-emitting device substrate and the encapsulating substrate is fully sealed, and thus the organic light-emitting display device can be protected more effectively.

In this method of sealing the substrate with a sealant such as frit, the frit is coated on the sealing part of the organic light-emitting display device, and a laser beam irradiation apparatus irradiates a laser beam on the sealing part of the organic light-emitting display device in motion to harden the frit, thereby sealing the substrate.

SUMMARY OF THE INVENTION

Exemplary embodiments of the present invention provide a laser beam irradiation apparatus for conveying desired laser intensity locally to the sealing part, and a method of manufacturing an organic light-emitting display device by using the same.

According to one exemplary embodiment of the present invention, there is provided a laser beam irradiation apparatus including: a laser source configured to emit light; a collimator configured to collimate the emitted light; a scanner configured to adjust the collimated light to change an irradiation direction thereof; a first lens part configured to focus the adjusted light to irradiate a laser beam on a sealing part; a camera configured to receive visible light passing through the scanner; a heat sensing part configured to receive infrared (IR) light passing through the scanner; and a control part configured to control a moving direction and an intensity of the laser beam.

According to one exemplary embodiment, there is provided a laser beam irradiation apparatus including: a laser source to emit light; a collimator configured to collimate the emitted light; a scanner configured to adjust the collimated light to change an irradiation direction thereof; a first dichroic mirror configured to reflect the adjusted light; a first lens part configured to focus the reflected light to irradiate a laser beam on a sealing part; a camera configured to receive visible light that is incident on the first lens part and passes through the first dichroic mirror; a heat sensing part configured to receive infrared (IR) light that is incident on the first lens part and passes through the first dichroic mirror; and a control part configured to control a moving direction and an intensity of the laser beam.

According to one exemplary embodiment, there is provided a method of manufacturing an organic light-emitting display device using a laser beam irradiation apparatus, including: forming an organic light-emitting part; forming a sealing part around the organic light-emitting part, the sealing part being formed on a first substrate or a second substrate; aligning the first substrate and the second substrate; and irradiating a laser beam such that the laser beam moves along the sealing part while performing a rotation motion, and an intensity of the laser beam is changed when the laser beam is performing the rotation motion.

It is to be understood that both the foregoing general description and the following detailed description are exemplary and explanatory and are intended to provide further explanation of the invention as claimed.

BRIEF DESCRIPTION OF THE DRAWINGS

The above and other features and advantages of the present invention will become more apparent by describing in detail exemplary embodiments thereof with reference to the attached drawings.

FIG. 1 is a cross-sectional view of part of the laser beam irradiation apparatus and the organic light-emitting display device.

DETAILED DESCRIPTION OF ILLUSTRATED EMBODIMENTS

Figure 1:
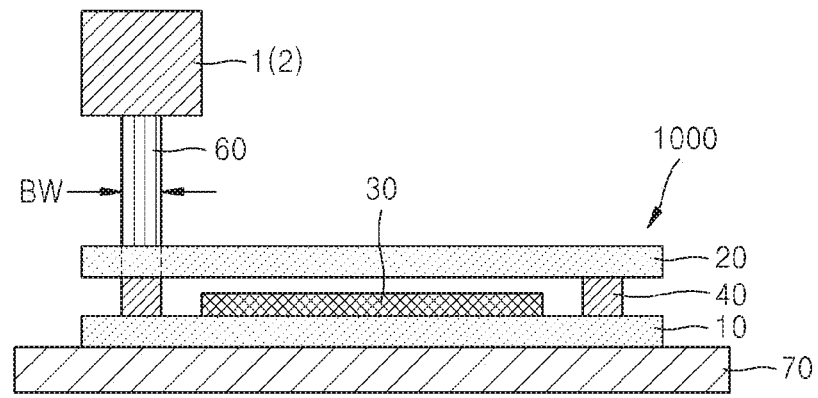
FIG. 1 is a schematic view illustrating a method of sealing a sealing part of an organic light-emitting display device by using a laser beam irradiation apparatus according to one exemplary embodiment.

Hereinafter, exemplary embodiments of the present invention will be described in more detail with reference to the accompanying drawings. The accompanying drawings, which are included to provide a further understanding of the invention and are incorporated in and constitute a part of this specification, illustrate embodiments of the invention, and together with the description serve to explain the principles of the invention.

In the drawings, the thickness of layers, films, panels, regions, etc. may be exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Figure 2:
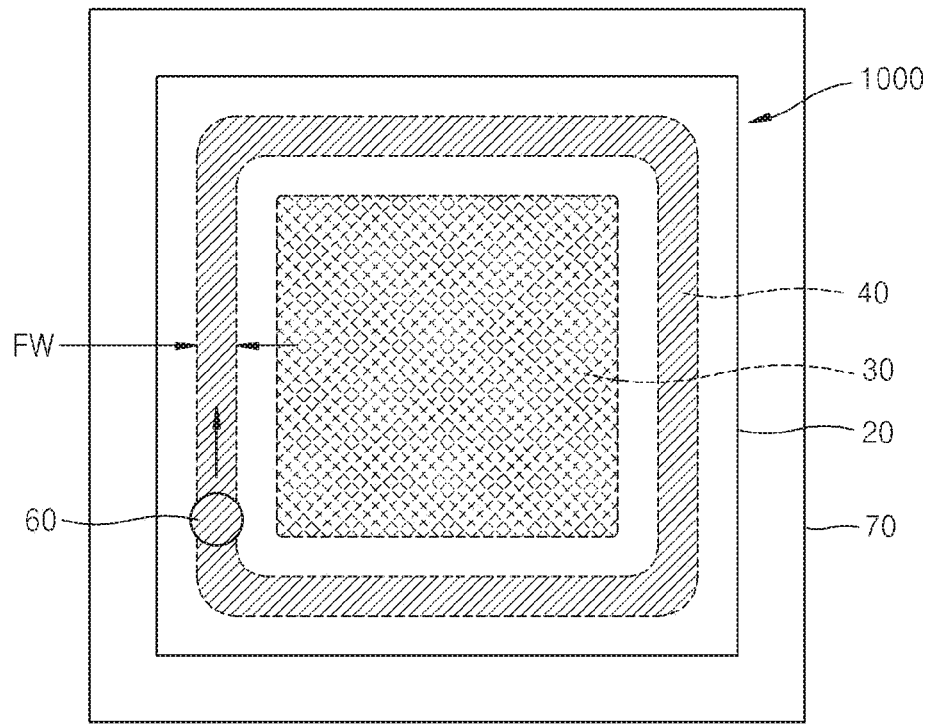
FIG. 2 is a top view of part of the laser beam irradiation apparatus and the organic light-emitting display device shown in FIG. 1.

FIG. 1 is a schematic view illustrating a method of sealing a sealing part 40 of an organic light-emitting display device 1000 by using laser beam irradiation apparatuses 1 and 2 according to one exemplary embodiment. FIG. 1 is a cross-sectional view of part of the organic light-emitting display device 1000 and the laser beam irradiation apparatuses 1 and 2. FIG. 2 is a top view of part of the organic light-emitting display device 1000 and the laser beam irradiation apparatuses 1 and 2 shown in FIG. 1.

Referring to FIGS. 1 and 2, an organic light-emitting part 30 and the sealing part 40 surrounding the organic light-emitting part 30 are disposed between a first substrate 10 and a second substrate 20, and a laser beam 60, which may be emitted from the laser beam irradiation apparatus 1 and/or 2, is irradiated on the sealing part 40.

In accordance with one exemplary embodiment, the organic light-emitting part 30 is formed on the first substrate 10. The first substrate 10 may be a substrate suitable to support the overlying structure. The first substrate 10 may include a flexible material, a glass substrate, a quartz substrate, and the like. For instance, the first substrate may be formed of glass.

In accordance with one exemplary embodiment, the second substrate 20 is an encapsulating substrate that encapsulates the organic light-emitting part 30 formed on the first substrate 10 and may include a substrate through which the laser beam 60 passes, as will be described below. The second substrate 20 may include a flexible material, a glass substrate, a quartz substrate, and the like. For instance, the second substrate 20 may be formed of glass.

Further, the organic light-emitting part 30 may include one or more organic light-emitting devices (OLEDs) (not shown) in which one or more organic layers (not shown), including an emitting layer between a first electrode (not shown) and a second electrode (not shown), are provided. Here, the first electrode (not shown) may act as an anode into which holes are supplied, and the second electrode (not shown) may act as a cathode into which electrons are supplied.

The OLEDs (not shown) may be categorized into the passive matrix type and the active matrix type depending on whether the driving of the OLEDs is controlled using a thin film transistor (TFT). Exemplary embodiments of the present disclosure may be applied to both the passive matrix and the active matrix types.

In accordance with one exemplary embodiment, the sealing part 40 may be formed on the second substrate 20 adjacent the above-described organic light-emitting part 30. For instance, the sealing part 40 may be formed on the second substrate 20 to surround the organic light-emitting part 30.

The sealing part 40 may form a closed loop for preventing contact between the organic light-emitting part 30 and external moisture or oxygen.

FIGS. 1 and 2 show that each of the corners of the sealing part 40 forming the closed loop is formed in the shape of a curve having a certain curvature. However, exemplary embodiments of the subject matter are not limited thereto. For instance, each corner of the sealing part 40 may form substantially an orthogonal shape with no or little curvature.

In accordance with one exemplary embodiment, a suitable sealant may be used as the sealing part 40 to secure the sealability between the first substrate 10 and the second substrate 20 and protect the organic light-emitting part 30 more effectively. The sealant may be formed to have a certain width FW by various methods, such as a screen printing method or a pen dispensing method. The sealant may be organic and/or inorganic materials. For instance, the sealant may be frit.

In accordance with one exemplary embodiment, after the sealing part 40 is formed on the second substrate 20, and the organic light-emitting part 30 is formed on the first substrate 10, the first substrate 10 and the second substrate 20 may be aligned with each other. However, exemplary embodiments of the subject matter are not limited thereto. For example, after the sealing part 40 may be formed on the first substrate 10 with the organic light-emitting part 30 formed thereon, the first substrate 10 may be aligned with and coupled to the second substrate 20.

Moreover, although it is illustrated in the drawing that one organic light-emitting part 30 is provided, one of ordinary skill in the art will appreciate that a plurality of organic light-emitting parts 30 and a plurality of sealing parts 40 respectively surrounding the plurality of organic light-emitting parts 30 may be provided between the first substrate 10 and the second substrate 20.

The laser beam irradiation apparatuses 1 and 2 may irradiate the laser beam 60 along a path of the sealing part 40 disposed between the first substrate 10 and the second substrate 20. The laser beam 60 may be irradiated on the sealing part 40 in the form of spot beams having a flat top profile.

In accordance with one exemplary embodiment, the first substrate 10 may be mounted on substrate stage 70 so that the substrate stage 70 is under the first substrate 10. The position of the laser beam 60 irradiated on the sealing part 40 may be relatively moved by moving the substrate stage 70. Alternatively/additionally, the position of the laser beam 60 may be moved by the motion of the laser beam irradiation apparatuses 1 and 2.

Figure 3:
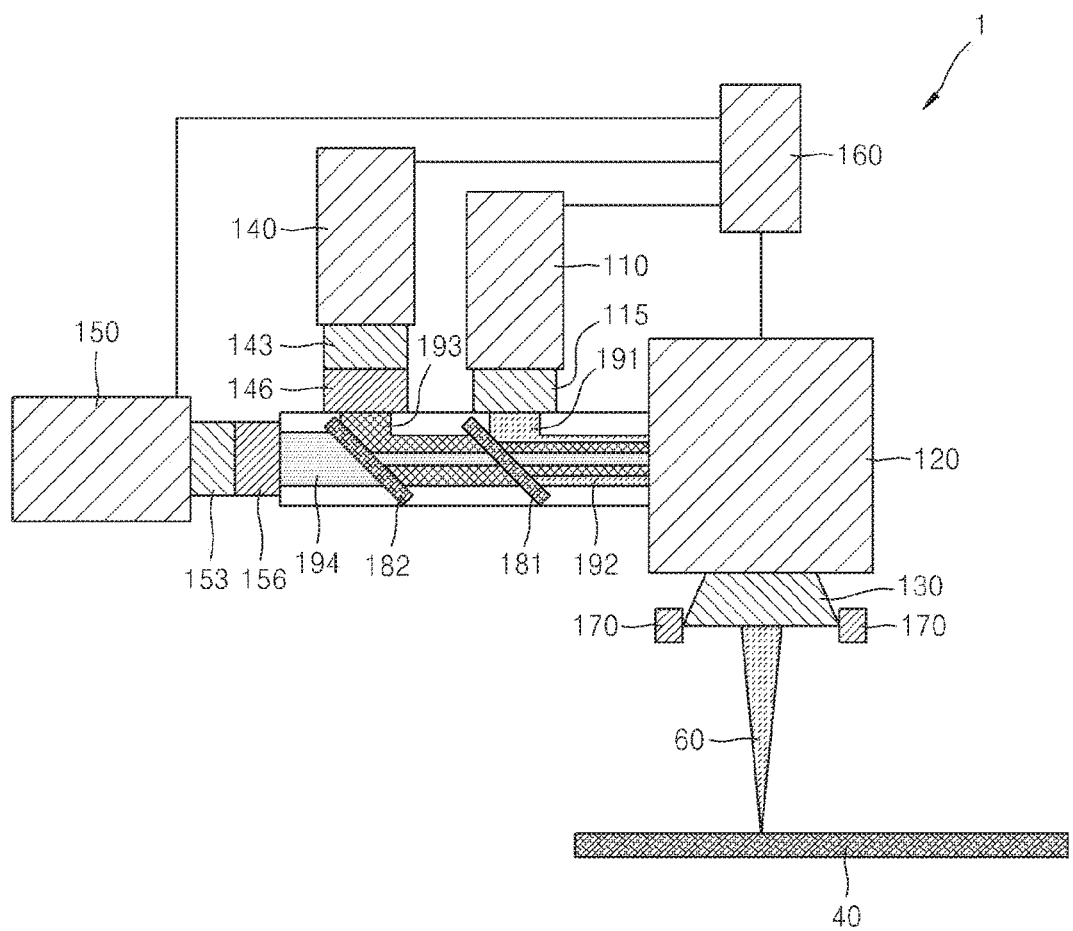
FIG. 3 is a view schematically illustrating a laser beam irradiation apparatus according to one exemplary embodiment.

FIG. 3 is a view schematically illustrating the laser beam irradiation apparatus 1 according to one exemplary embodiment.

Referring to FIG. 3, the laser beam irradiation apparatus 1 according to one exemplary embodiment may include a laser source 110, a scanner 120, a first lens part 130, a camera 140, a heat sensing part 150, a control part 160, an illumination part 170, a first dichroic mirror 181, and a second dichroic mirror 182.

The laser source 110 may generate laser light. In accordance with one embodiment, laser light having a wavelength of 808 nm may be emitted from the laser source 110.

A collimator 115 may be connected to the output of the laser source 110. The collimator 115 changes the light emitted from the laser source 110 to collimated light 191. The collimator 115 may have a focal distance of 50 nm.

The scanner 120 may be disposed on the path of collimated light 191 from the collimator 115. The collimated light 191 from the collimator 115 may be reflected to the scanner 120 by the first dichroic mirror 181.

The scanner 120 may include a reflective part (not shown), which reflects the collimated light 191 from the collimator 115 to the sealing part 40, and a driving part (not shown) that drives the reflective part. A portion of the reflective part (not shown) may use a galvanometer mirror that precisely controls the position and speed of a laser beam, for instance, for the rotation motion of the laser beam 60 according to one exemplary embodiment. The galvanometer mirror may have a high reflectivity at a wavelength band of 450 nm to 2,600 nm.

In accordance with one exemplary embodiment, the first lens part 130 may be disposed on the path of light passing through the scanner 120. The light passing through the scanner 120 may be collected by the first lens part 130. The first lens part 130 may include an F-theta lens. The F-theta lens may have a focal distance of 80 nm.

In accordance with one exemplary embodiment, the light of all wavelengths reflected by the sealing part 40 passes back through the scanner 120.

For instance, the visible light 193 reflected by the sealing part 40 is incident on the camera 140. Thus, visual information relating to the sealing operation may be provided by the camera 140 simultaneously with the operation. In accordance with one exemplary embodiment, the camera 140 may be a charged coupled device (CCD) camera.

A focusing lens 143 may be coupled to the camera 140. The focusing lens 143 may be used for adjusting the magnification of the image fed to the camera 140. For instance, the focusing lens 143 may have a focal distance of 80 nm. A bandpass filter 146 may be coupled to the focusing lens 143. The bandpass filter 146 may be a filter that passes only the light of a wavelength band of 532 nm to 615 nm.

In accordance with one exemplary embodiment, the infrared (IR) light 194 reflected by the sealing part 40 is incident on the heat sensing part 150. Thus, thermal information relating to the sealing operation may be provided by the heat sensing part 150 simultaneously with the sealing operation. The heat sensing part 150 may be, for instance, a pyrometer or an IR camera.

A focusing lens 153 may be coupled to the heat sensing part 150. The focusing lens 153 may have a focal distance of 40 nm or 80 nm. An IR blocking filter silicon 156 may be coupled to the focusing lens 153. The IR blocking filter silicon 156 can prevent IR light from being leaked to the outside.

In accordance with one exemplary embodiment, the control part 160 controls the moving direction and intensity of the laser beam 60. The control part 160 may include a program for controlling a galvanometer mirror (not shown), which controls the position and speed of the laser beam 60 in order for the laser beam 60 to have varying intensity and rotational moves, and a laser driver that changes the intensity of the laser beam 60 in each segment of the rotation motion of the laser beam 60.

In accordance with one exemplary embodiment, the illumination part 170 may irradiate light on the sealing part 40 to illuminate the periphery of the sealing part 40. The illumination part 170 may use a light-emitting diode (LED), and have a wavelength of 532 nm to avoid overlapping with the wavelength band of the laser beam 60, the visible light band to be used for real-time measurement, and the IR band to be used for real-time measurement.

The first dichroic mirror 181 may be disposed on the path of light passing through the collimator 115 and the path of light of all wavelengths which is reflected by the sealing part 40 and passes back through the scanner 120. The first dichroic mirror 181 may have a high reflectivity at the wavelength of light passing through the collimator 115, and may have a high transmittance at the visible light wavelength band and the IR wavelength band. For instance, the first dichroic mirror 181 may have a high reflectivity at a wavelength band of 808 nm, and may have a high transmittance at a wavelength band of 532 nm to 615 nm and 1.5 μm to 2.3 μm. Therefore, light from the laser source 110 and the collimator 115 is reflected by the first dichroic mirror 181, and is incident on the scanner 120. Among the light of all wavelengths which is reflected by the sealing part 40 and passes back through the scanner 120, light 192 having the same wavelength band as that of the light from the laser source 110 and the collimator 115 is filtered by the first dichroic mirror 181. Among the light of all wavelengths which is reflected by the sealing part 40 and passes back through the scanner 120, the visible light 193 and the IR light 194 pass through the first dichroic mirror 181.

The second dichroic mirror 182 may be disposed on the path of light passing through the first dichroic mirror 181. The second dichroic mirror 182 may have a high reflectivity at the wavelength band of visible light, and may have a high transmittance at the IR wavelength band. For instance, the second dichroic mirror 182 may have a high reflectivity at a wavelength band of 532 nm to 615 nm, and may have a high transmittance at a wavelength band of 1.5 μm to 2.3 μm.

Therefore, the visible light 193 is reflected by the second dichroic mirror 182 and is incident on the camera 140, and the IR light 194 passes through the second dichroic mirror 182 and is incident on the heat sensing part 150. Thus, visual information may be provided by the camera 140 simultaneously with the sealing operation, while thermal information may be provided by the heat sensing part 150 simultaneously with the sealing operation.

Light emitted from the laser source 110 is changed to the collimated light 191 by the collimator 115, reflected by the first dichroic mirror 181, and incident on the scanner 120. The direction of the light incident on the scanner 120 may be changed by the scanner 120, and thus the laser beam 60 may be irradiated on the sealing part 40.

Among the light of all wavelengths reflected by the sealing part 40, light having the same wavelength band as that of the light emitted from the laser source 110 is changed in directions by the scanner 120, and filtered by the first dichroic mirror 181. Among the light of all wavelengths reflected by the sealing part 40, the visible light 193 is changed in directions by the scanner 120, passes through the first dichroic mirror 181, is reflected by the second dichroic mirror 182, and is irradiated onto the camera 140. Among the light of all wavelengths reflected by the sealing part 40, the IR light 194 is changed in directions by the scanner 120, passes through the first dichroic mirror 181 and the second dichroic mirror 182, and is irradiated onto the heat sensing part 150.

Figure 4:
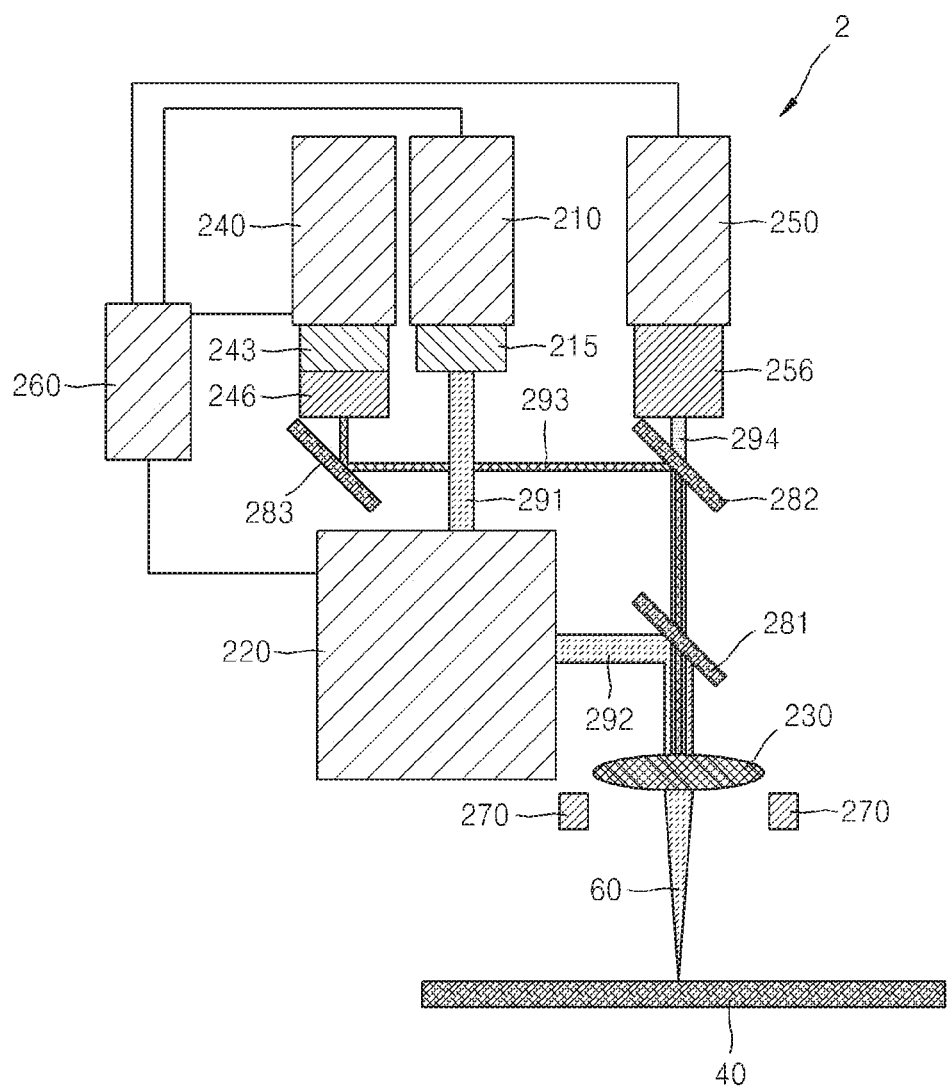
FIG. 4 is a view schematically illustrating a laser beam irradiation apparatus according to one exemplary embodiment.

FIG. 4 is a view schematically illustrating the laser beam irradiation apparatus 2 according to one exemplary embodiment.

Referring to FIG. 4, the laser beam irradiation apparatus 2 according to one exemplary embodiment may include a laser source 210, a scanner 220, a second lens part 230, a camera 240, a heat sensing part 250, a control part 260, an illumination part 270, a third dichroic mirror 281, a fourth dichroic mirror 282, and a fifth dichroic mirror 283.

The laser source 210 may generate laser light. For instance, laser light having a wavelength of 808 nm may be emitted from the laser source 210.

A collimator 215 may be connected to the output of the laser source 210. The collimator 215 changes the light emitted from the laser source 210 to collimated light 291. The collimator 215 may have a focal distance of 30 nm.

The scanner 220 may be disposed on the path of the collimated light 291 from the collimator 215. The collimated light 291 from the collimator 215 may be directly incident on the scanner 220.

The scanner 220 may include a reflective part (not shown), which reflects the collimated light 291 from the collimator 215 to the sealing part 40, and a driving part (not shown) that drives the reflective part. A portion of the reflective part (not shown) may use a galvanometer mirror that precisely controls the position and speed of a laser beam for the rotation motion of the laser beam 60 according to one exemplary embodiment. The galvanometer mirror may have a high reflectivity at a wavelength band of 808 nm.

In accordance with one exemplary embodiment, the second lens part 230 may be disposed on the path of light 292 passing through the scanner 220. The light 292 passing through the scanner 220 may be reflected by the third dichroic mirror 281 and irradiated on the second lens part 230. The light 292 passing through the scanner 220 may be collected by the second lens part 230. The second lens part 230 may include an F-theta lens. The F-theta lens may have a size of 2" to 3".

In accordance with one exemplary embodiment, the light of all wavelengths reflected by the sealing part 40 passes back through the second lens part 230.

For instance, the visible light 293 reflected by the sealing part 40 is incident on the camera 240. Visual information relating to the sealing operation may be provided by the camera 240 simultaneously with the operation. The camera 240 may be a CCD camera.

A focusing lens 243 may be coupled to the camera 240. The focusing lens 243 may be used for adjusting the magnification of the image fed to the camera 240. The focusing lens 243 may have a focal distance of 100 nm. A bandpass filter 246 may be coupled to the focusing lens 243. The bandpass filter 246 may be a filter that passes only the light of a wavelength band of 525 nm.

In accordance with one exemplary embodiment, the IR light 294 reflected by the sealing part 40 is incident on the heat sensing part 250. Thermal information relating to the sealing operation may be provided by the heat sensing part 250 simultaneously with the operation. The heat sensing part 250 may be a pyrometer or an IR camera.

An IR blocking filter 256 may be coupled to the heat sensing part 250. The blocking filter 256 can shut off light having the same wavelength as the light of the laser source 210. The IR blocking filter 256 may shut off light having a wavelength of 808 nm, and thus only IR light may reach the heat sensing part 150.

In accordance with one exemplary embodiment, the control part 260 controls the moving direction and intensity of the laser beam 60. The control part 260 may include a program for controlling a galvanometer mirror (not shown), which controls the position and speed of the laser beam 60 in order for the laser beam 60 to have varying intensity and rotational moves, and a laser driver that changes the intensity of the laser beam 60 in each segment of the rotation motion of the laser beam 60.

In accordance with one exemplary embodiment, the illumination part 270 irradiates light on the sealing part 40 to illuminate the periphery of the sealing part 40. The illumination part 270 may use an LED, and have a wavelength of 532 nm to avoid overlapping with the wavelength band of the laser beam 60, a visible light band to be used for real-time measurement, and an IR band to be used for real-time measurement.

The third dichroic mirror 281 may be disposed on the path of the light 292 passing through the scanner 220 and the path of light of all wavelengths which is reflected by the sealing part 40 and passes back through the second lens part 230. The third dichroic mirror 281 may have a high reflectivity at the wavelength band of the laser source 210, and may have a high transmittance at the visible light wavelength band and the IR wavelength band. For instance, the third dichroic mirror 281 may have a high reflectivity at a wavelength band of 808 nm, and may have a high transmittance at a wavelength band of 532 nm and 1,000 nm to 7,000 nm. Therefore, light from the scanner 220 is reflected by the third dichroic mirror 281, and is incident on the second lens part 230. Among the light of all wavelengths which is reflected by the sealing part 40 and passes back through the second lens part 230, light 292 having the same wavelength band as that of the light from the laser source 210 and the collimator 215 is filtered by the third dichroic mirror 281. Among the light of all wavelengths which is reflected by the sealing part 40 and passes back through the second lens part 230, the visible light 293 and the IR light 294 pass through the third dichroic mirror 281.

The fourth dichroic mirror 282 may be disposed on the path of light passing through the third dichroic mirror 281. The fourth dichroic mirror 282 may have a high reflectivity at the wavelength band of visible light, and may have a high transmittance at the IR wavelength band. For instance, the fourth dichroic mirror 282 may have a high reflectivity at a wavelength band of 525 nm, and may have a high transmittance at a wavelength band of 1,000 nm to 7,000 nm. Therefore, the visible light 293 is reflected by the fourth dichroic mirror 282, and the IR light 294 passes through the fourth dichroic mirror 282 and is incident on the heat sensing part 250. Thus, thermal information relating to the sealing operation may be provided by the heat sensing part 250 simultaneously with the operation.

The fifth dichroic mirror 283 may be disposed on the path of light reflected by the fourth dichroic mirror 282. The fifth dichroic mirror 283 may have a high reflectivity at the wavelength band of visible light. For instance, the fifth dichroic mirror 283 may have a high reflectivity at a wavelength band of 525 nm. Therefore, the visible light 293 is reflected by the fifth dichroic mirror 283, and is incident on the camera 240. Thus, visual information relating to the sealing operation may be provided by the camera 240 simultaneously with the operation.

Light emitted from the laser source 210 is changed to the collimated light 291 by the collimator 115, and is incident on the scanner 220. The direction of the light incident on the scanner 220 may be changed by the scanner 220, and the light 292 passing through the scanner 220 is reflected by the third dichroic mirror 281. Light reflected by the third dichroic mirror 281 may be collected by the second lens part 230, and thus the laser beam 60 may be irradiated on the sealing part 40.

Among the light of all wavelengths reflected by the sealing part 40, light having the same wavelength band as that of the light emitted from the laser source 210 passes through the second lens part 230, and is filtered by the third dichroic mirror 281. Among the light of all wavelengths reflected by the sealing part 40, the visible light 293 passes through the second lens part 230 and the third dichroic mirror 281, is reflected by the fourth dichroic mirror 282 and the fifth dichroic mirror 283, and is irradiated onto the camera 240. Among the light of all wavelengths reflected by the sealing part 40, the IR light 294 sequentially passes through the second lens part 230, the third dichroic mirror 281, and the fourth dichroic mirror 282, and is irradiated onto the heat sensing part 250.

Figure 5:
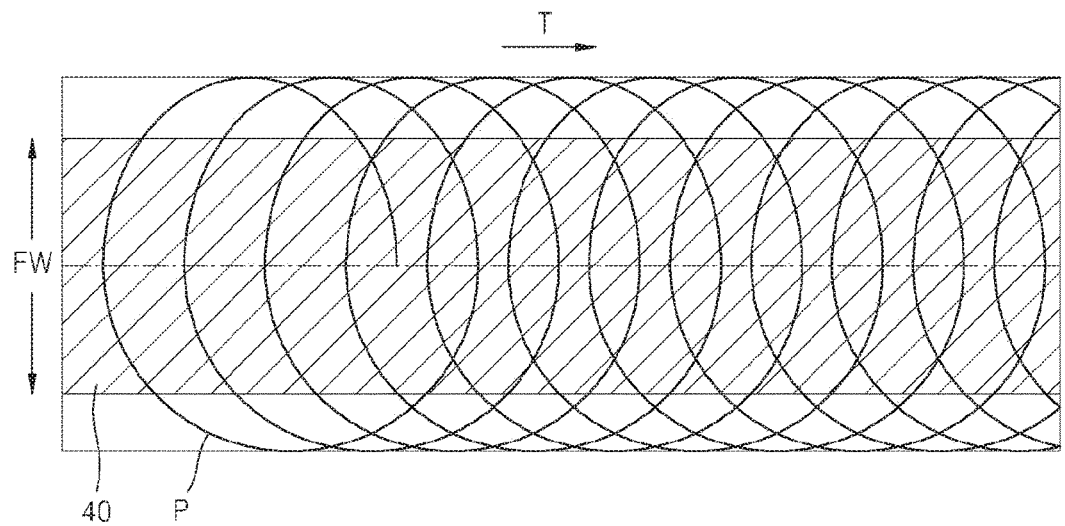
FIG. 5 is a view illustrating a motion path of a laser beam according to one exemplary embodiment.
Figure 6:
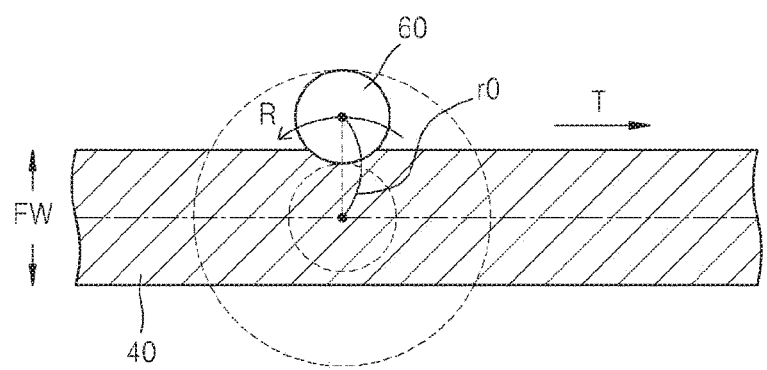
FIG. 6 is a view illustrating a rotation motion and rectilinear motion of a laser beam according to one exemplary embodiment.
Figure 7:
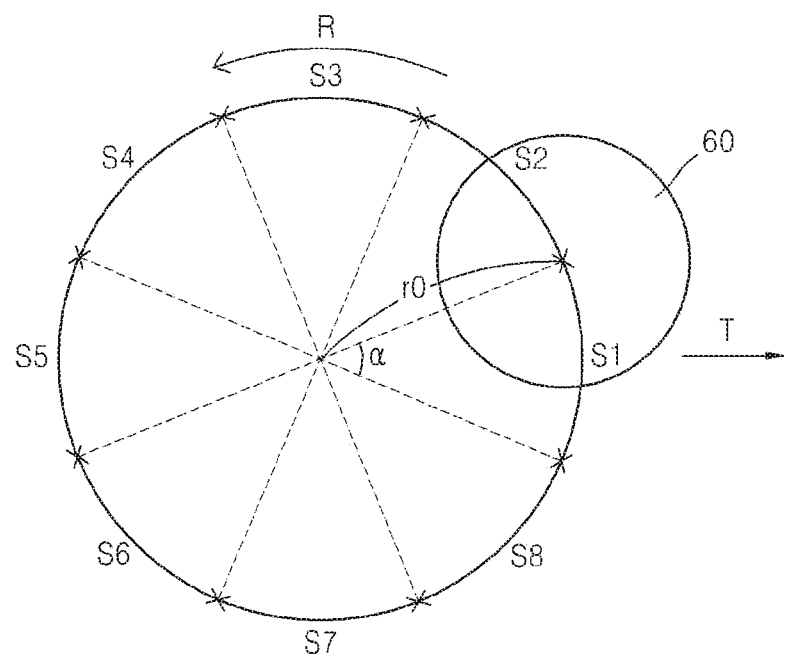
FIG. 7 is a view illustrating an intensity change of a laser beam in the rotation motion of the laser beam according to one exemplary embodiment.

FIG. 5 is a view illustrating a motion path P of the laser beam 60, according to one exemplary embodiment. FIG. 6 is a view illustrating a rotation motion R and rectilinear motion T of the laser beam 60, according to one exemplary embodiment. FIG. 7 is a view illustrating the intensity change of the laser beam 60 in the rotation motion R of the laser beam 60, according to one exemplary embodiment.

Referring to FIGS. 5 and 6, the laser beam 60 according to one exemplary embodiment has the motion path P in which the rotation motion R and the rectilinear motion T are combined, and slowly moves along a sealing path of the sealing part 40. As illustrated, the motion path P of the laser beam 40 may be designed to have, for instance, circular trajectories that may appropriately overlap each other. That is, the circular trajectories may be intended to appropriately overlap each other so that optimal energy is transferred to the frit to thus seal effectively. The laser beam 60 may perform the rotation motion R with a certain rotation radius r0. The laser beam 60 may be irradiated in the form of spot beams having a flat top profile. Referring to FIG. 6, the laser beam 60 in the form of a spot beam performs the rotation motion R around an axis with the rotation radius r0. When the center point of the spot beam makes one round to come back to the original point, the laser beam 60 may complete one cycle (or one period) of the rotation motion R according to one exemplary embodiment.

The rotation motion R of the laser beam 60 may be performed by the scanners 120 and 220 and the control parts 160 and 260. The laser beam irradiation apparatuses 1 and 2 may be moved by a linear motor, and thus the laser beam 60 may perform the rectilinear motion T. Also, the substrate stage 70 under the sealing part 40 moves, and thus the laser beam 60 may perform the rectilinear motion T.

In order to enable desired beam morphing, the cross-sectional diameter of the laser beam 60 should have a sufficient magnitude, but may be less than the width FW of the sealing part 40. Specifically, the diameter of the spot beam may be ¼ to ¾ times the frit width.

Further, in accordance with one exemplary embodiment, in performing the rotation motion R of the spot beam, the spot beam in substantially circular shape may be rotated so that its circular trajectory does not overlap during one cycle of rotation. Therefore, the minimum rotation radius of the spot beam may be decided to be the smallest rotation radius with which the circular trajectory of the spot beam does not overlap during one cycle of rotation. Therefore, the minimum rotation radius may be the radius of the spot beam. For example, when the diameter of the spot beam is 1.3 mm, the minimum rotation radius of the rotation motion R of the spot beam is 0.65 mm. For example, when the diameter of the spot beam is 1.3 mm, and the rotation radius r0 of the rotation motion R of the spot beam is 1.3 mm, the diameter of the outermost circle based on the rotation motion R of the spot beam is 3.9 mm.

The laser beam 60 may circularly perform the rotation motion R at a speed faster than the rectilinear motion T. When the frit width is 100 mm, the rotation frequency of the rotation motion R of the spot beam may be 50 Hz or higher. For instance, the rotation frequency may be in a range of 40-60 Hz. The laser beam 60 circularly performs the rotation motion R at a high speed, and thus desired beam morphing is possible.

Referring to FIG. 7, when the laser beam 60 is performing the rotation motion R, the intensity of the laser beam 60 may be changed.

The laser beam 60 has the motion path P in which the rotation motion R and the rectilinear motion T are combined, and the intensity of the laser beam 60 is changed in each segment of the rotation motion R. Therefore, desired beam morphing is possible, and desired varying laser intensity may be transferred to the frit.

In accordance with one exemplary embodiment, the circumference of the path of the rotation motion R is divided into a plurality of segments at certain angles α, and the segments may have different laser intensities. Such variation may be supported by the laser drivers of the control parts 160 and 260. According to one exemplary embodiment, the circumference of the path of the rotation motion R may be divided at intervals of 45 degrees. Therefore, the circumference of the path of the rotation motion R may be divided into a first segment S1, a second segment S2, a third segment S3, a fourth segment S4, a fifth segment S5, a sixth segment S6, a seventh segment S7, and an eighth segment S8. The first segment S1 has a first laser beam intensity, the second segment S2 has a second laser beam intensity, the third segment S3 has a third laser beam intensity, the fourth segment S4 has a fourth laser beam intensity, the fifth segment S5 has a fifth laser beam intensity, the sixth segment S6 has a sixth laser beam intensity, the seventh segment S7 has a seventh laser beam intensity, and the eighth segment S8 has an eighth laser beam intensity.

The laser beam 60 has the motion path P in which the rotation motion R and the rectilinear motion T are combined, the circumference of the path of the rotation motion R is divided into the eight segments having different intensities, and the intensities of eight segments are controlled, and thus a desired beam profile is realized. Therefore, in a segment in which the type of the lower layer of the frit is locally changed or its geometry is changed, the beam profile may be momentarily adjusted according to the change, thus preventing damage to local wiring or the like. Also, the laser intensity inside the corner of the frit should be reduced by about half of the laser intensity outside the corner, and since the beam profile can be adjusted at the corner, sealing quality outside and inside the corner can be maintained uniform.

According to exemplary embodiments of the present invention, a high-quality frit sealing process can be performed without thermal damage to peripheral elements.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A laser beam irradiation apparatus comprising:
   a laser source configured to emit light;
   a collimator configured to collimate the emitted light;
   a scanner configured to adjust the collimated light to change an irradiation direction thereof;
   a first lens part configured to focus the adjusted light to irradiate a laser beam on a sealing part;
   a camera configured to receive visible light passing through the scanner;
   a heat sensing part configured to receive infrared (IR) light passing through the scanner; and
   a control part configured to control a moving direction and an intensity of the laser beam,
   wherein:
   the moving direction follows a rotation motion;
   the circumference of a path of the rotation motion is divided into a plurality of segments, each segment subtending the same angle of the rotation motion; and
   the control part comprises a laser driver and is configured to vary an amount of power applied to produce the laser beam by the laser source in order to vary the intensity of the laser beam to be different in each of the plurality of segments independently of the motion of the laser beam.

2. The laser beam irradiation apparatus of claim 1, further comprising a dichroic mirror configured to reflect the collimated light from the collimator to the scanner and to filter light that has the same wavelength as laser light and is incident on the scanner.

3. The laser beam irradiation apparatus of claim 1, further comprising a dichroic mirror configured to reflect the visible light onto the camera and to pass the IR light onto the heat sensing part.

4. The laser beam irradiation apparatus of claim 1, further comprising an illumination part configured to irradiate illumination light on the sealing part.

5. The laser beam irradiation apparatus of claim 1, wherein the control part is further configured to cause the laser beam to move along a first direction while performing the rotation motion.

6. The laser beam irradiation apparatus of claim 5, wherein a frequency of the rotation motion is in a range of 50-60 Hz.

7. The laser beam irradiation apparatus of claim 5, wherein the control part is further configured to cause the rotation motion of the laser beam such that the laser beam forms a trajectory that does not overlap during one period of the rotation motion.

8. The laser beam irradiation apparatus of claim 5, wherein:
   the scanner comprises a galvanometer mirror configured to enable the rotation motion; and
   the control part further comprises a program configured to control the galvanometer mirror.

* * * * *